United States Patent
Albinet (10) Patent No.: US 8,786,477 B1
(45) Date of Patent: Jul. 22, 2014

(54) DIGITAL-TO-ANALOG CONVERSION WITH IMPROVED DYNAMIC RANGE

(71) Applicant: Texas Instruments Incorporated, Dallas, TX (US)

(72) Inventor: Xavier Albinet, Roquefort les Pins (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/804,501

(22) Filed: Mar. 14, 2013

(30) Foreign Application Priority Data

Mar. 13, 2013 (EP) ..................................... 13290057

(51) Int. Cl.
*H03M 1/70* (2006.01)
*H03M 1/66* (2006.01)
*H03M 1/18* (2006.01)

(52) U.S. Cl.
CPC ........ *H03M 1/70* (2013.01); *H03M 1/66* (2013.01); *H03M 1/18* (2013.01)

USPC ............................................. 341/139; 341/144

(58) Field of Classification Search
CPC ........... H03M 1/16; H03M 1/18; H03M 1/66; H03M 1/70
USPC .................................................. 341/139, 144
See application file for complete search history.

(56) References Cited

U.S. PATENT DOCUMENTS

| | | | | |
|---|---|---|---|---|
| 6,292,120 | B1 * | 9/2001 | Painchaud et al. | 341/139 |
| 8,326,340 | B2 * | 12/2012 | Nalbantis et al. | 455/522 |
| 8,538,354 | B2 * | 9/2013 | Xu et al. | 455/127.1 |
| 2002/0018013 | A1 * | 2/2002 | Nakao et al. | 341/144 |

* cited by examiner

*Primary Examiner* — Howard Williams
(74) *Attorney, Agent, or Firm* — Alan A. R. Cooper; Frederick J. Telecky, Jr.

(57) ABSTRACT

An audio downlink path is provided including a Dynamic Range Boost (DRB), a modified Digital-to-Analog Converter (DAC), and a modified audio driver gain control to produce a very high Dynamic Range (DR) while maintaining a limited scale and complexity of the components within the audio downlink path.

20 Claims, 4 Drawing Sheets

DIGITAL-TO-ANALOG CONVERSION WITH IMPROVED DYNAMIC RANGE

RELATED APPLICATION(S)

This application claims the benefit of European Patent Application No. 13290057.2, filed Mar. 13, 2013, the contents of which are incorporated by reference as if fully rewritten herein.

TECHNICAL FIELD

This invention relates generally to digital-to-analog conversion.

BACKGROUND

Audio downlink paths or other circuitry involving digital-to-analog conversion, as generally understood in the art, are used to convert a digital input signal to an analog output signal. During this process, however, noise can be added into the signal by various processes (analog or digital) performed on the signal as it progresses through the conversion downlink path. It is sometimes desired to have a high dynamic range (DR) to produce a high signal-to-noise ratio (SNR) at low inputs. One known solution includes designing and manufacturing each component in the downlink path to incorporate a high dynamic range. However, this adds cost to each component, and in particular, to the digital-to-analog converter (DAC). A DAC with a high DR is very complex, can be risky to design and manufacture (more opportunity for failures, etc), and occupies more silicon area. Other known solutions include dynamically increasing input signals and decreasing audio driver gain, but these solutions can inject delays that cause distortion and actually increase noise.

SUMMARY

Generally speaking and pursuant to these various approaches, a new audio downlink path is provided that produces a high Dynamic Range (DR), while limiting the scale and complexity of the components used within the downlink path. The new audio downlink path includes a Dynamic Range Boost (DRB), a modified digital-to-analog converter (DAC), and audio driver gain control to effectuate the high DR while maintaining the limited scale and complexity of the components.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
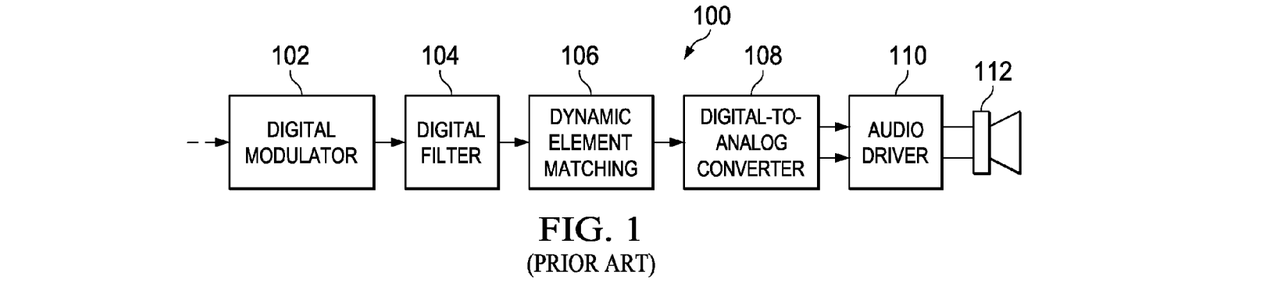
FIG. 1 is a prior art example of an audio downlink path.

Referring now to the drawings, FIG. 1 illustrates an example prior art audio downlink path 100 or pipeline including a digital modulator 102 (such as a sigma-delta digital modulator), an optional digital filter 104, a Dynamic Element Matching module (DEM) 106, a digital-to-analog converter (DAC) 108, and an audio driver 110. This downlink path 100 may be connected to, for example, a speaker 112 or other physical driver to create mechanical vibrations corresponding to the audio signal, in other words, to effect playing the audio. In this example, a digital audio track is converted into a signal that can be played by a speaker for a listener. Although the example prior art audio downlink path 100, as well as the new audio downlink path 200 (see FIG. 2), are each described as "audio downlink paths," they may be well suited for other purposes requiring digital-to-analog conversion, and the teachings described herein may be readily applicable to digital imaging, motor or lighting control, machinery, automation, robotics, and other areas that may benefit from high dynamic range (DR) digital-to-analog conversion.

The digital modulator 102 operates to create a digital modulated signal as corresponds to an incoming digital signal. Such examples include Pulse Density Modulation (PDM), Pulse Width Modulation (PWM) and the like. Typically, the digital modulated signal will alternate between two levels, for example, hi and lo corresponding to 1 and 0 in binary. In a PDM approach, as is understood in the art, the density of the 1's and 0's directly correspond to the value of the output signal. The digital modulator 102 may or may not be incorporated directly into an audio downlink path 100 and may, by some approaches, be included as a separate component from the downlink path and may serve to feed the downlink path 100 an incoming signal. Further, by other approaches, the digital modulator may include therein a digital filter 104.

The digital filter 104 is coupled to the output of the digital modulator 102 and operates as a low-pass filter (LPF) in the digital domain to filter the incoming modulated signal to create an LPF output signal. The output signal of the digital filter 104 will have N levels of resolution. For example, when using sigma-delta modulation, the resolution N may have 17 levels (which includes an additional level to account for jitter).

This digital filter 104 output signal can then optionally be fed into a Dynamic Element Matching (DEM) module 106 that operates to correct for mismatches among circuit elements that should be ideally identical. These inevitable mismatches create harmonics which has the effect of increasing the Total Harmonic Distortion (THD) or adding other nonlinear distortion in the output signal, which adds noise and degrades the performance of the audio downlink path 100. A DEM 106 is not always necessary for the audio downlink path 100 to operate, however, it is often needed to produce an output signal of suitable quality. The signal out of the DEM 106 is fed into the Digital-to-Analog Converter (DAC) 108, which will convert the incoming digital signal to an analog output signal that is suitable for use by an audio driver 110 (i.e., analog amplifier) to drive a speaker 112 or the like.

The DAC 108 will inevitably introduce noise on the signal. Sources of the added noise from the DAC 108 include noise generated by the DAC 108 amplifier, from thermal noise from the switching capacitors, and noise input on various reference voltages. When the input signal to the DAC 108 is very low, this noise can overtake the input signal to a point where "the signal gets lost in the noise." This represents a very low or poor signal-to-noise ratio (SNR). This also establishes the lower end of the dynamic range (DR) of the output (with the upper end represented by the loudest undistorted output, being the saturation point of the output signal). Thus, the DR is limited primarily by how low a signal can get before the noise overtakes the signal. The performance of the DAC 108 is often the most critical and limiting factor influencing DR.

An increased DR is often desirable. One way to achieve this, as discussed in the Background above, is to ensure that the components in the downlink path 100, and particularly with the DAC 108, have much higher resolution N so that the noise introduced is much lower, thus increasing the DR. However, and particularly with the DAC 108, such increased resolution introduces added complexity, cost, size, and risks to both the design and manufacture of the components.

Figure 2:
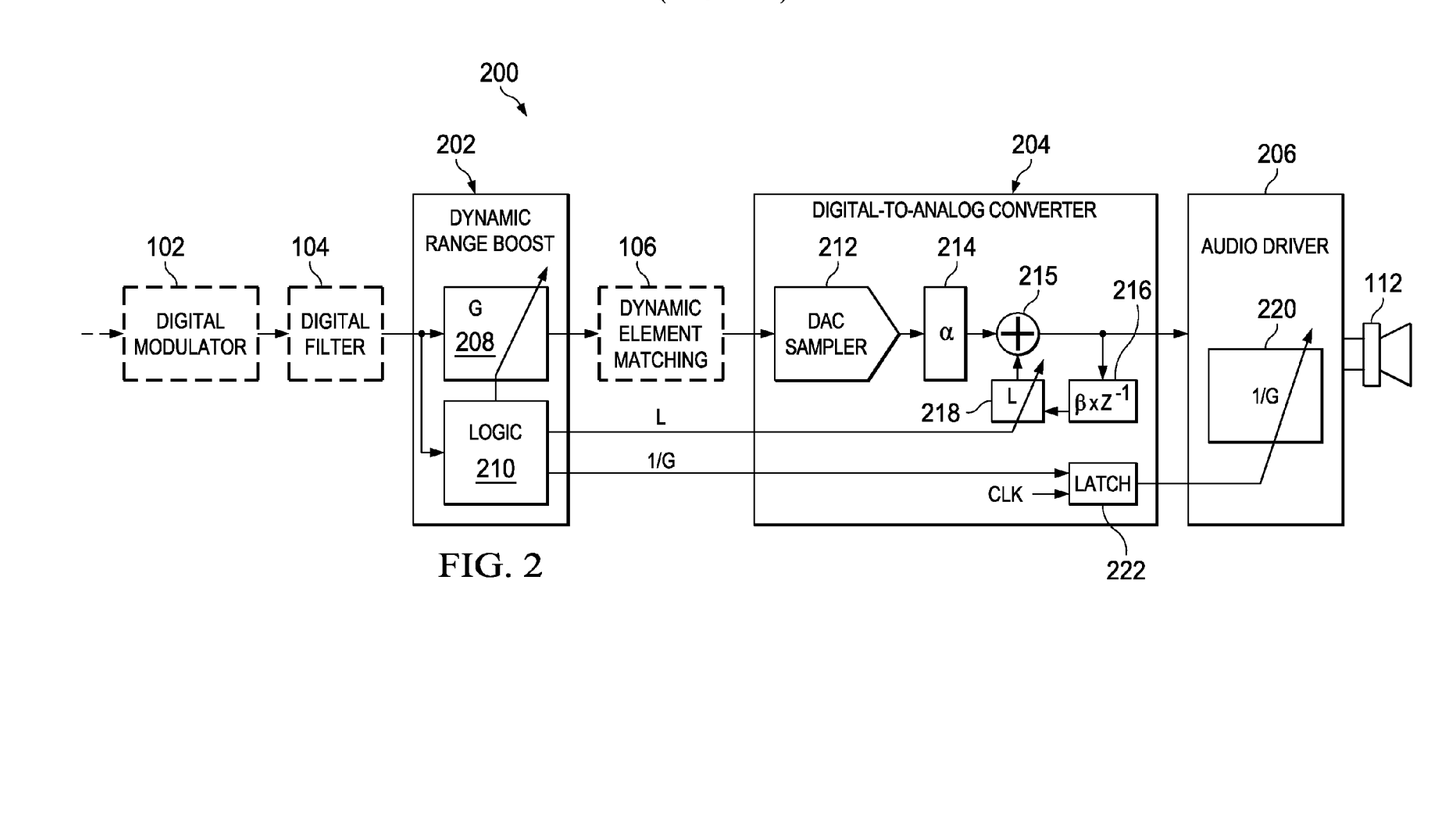
FIG. 2 illustrates an example new audio downlink path in accordance with various approaches.

Turning now to FIG. 2, a new audio downlink path 200 is shown in accordance with various approaches that increase DR without necessarily increasing the resolution of the components within the downlink path 200. The new downlink path 200 includes a new module called a Dynamic Range Boost (DRB) 202 as well as a modified DAC 204 and audio driver 206. As before, the audio downlink path 200 may also include a digital modulator 102 (often a digital sigma-delta modulator), digital filter 104, and Dynamic Element Matching (DEM) module 106. As before, the DEM 106 is not necessarily required for operation of the new audio downlink path 200 and a digital filter 104 may optionally be incorporated into the digital modulator 102. The DRB 202 is inserted between the digital filter 104 and the DEM 106 and receives the output of the digital filter 104 and in turn outputs a boosted signal to the DEM 106.

In operation, the DRB 202 acts to dynamically maximize the incoming signal so that it occupies more of the digital range of the system before it goes through digital-to-analog conversion in the DAC 204. By this, the dynamic range that would be otherwise limited by the DAC 204 is increased because even very low signals are digitally amplified prior to entry into the DAC 204 so that they exist well above the noise floor and do not risk being lost in the noise. The DRB 202 includes a digital gain stage 208 that serves to amplify or attenuate the incoming digital signal by a gain G. The gain G is calculated by a logic module 210, the specifics of which are described later in this disclosure.

Figure 4:
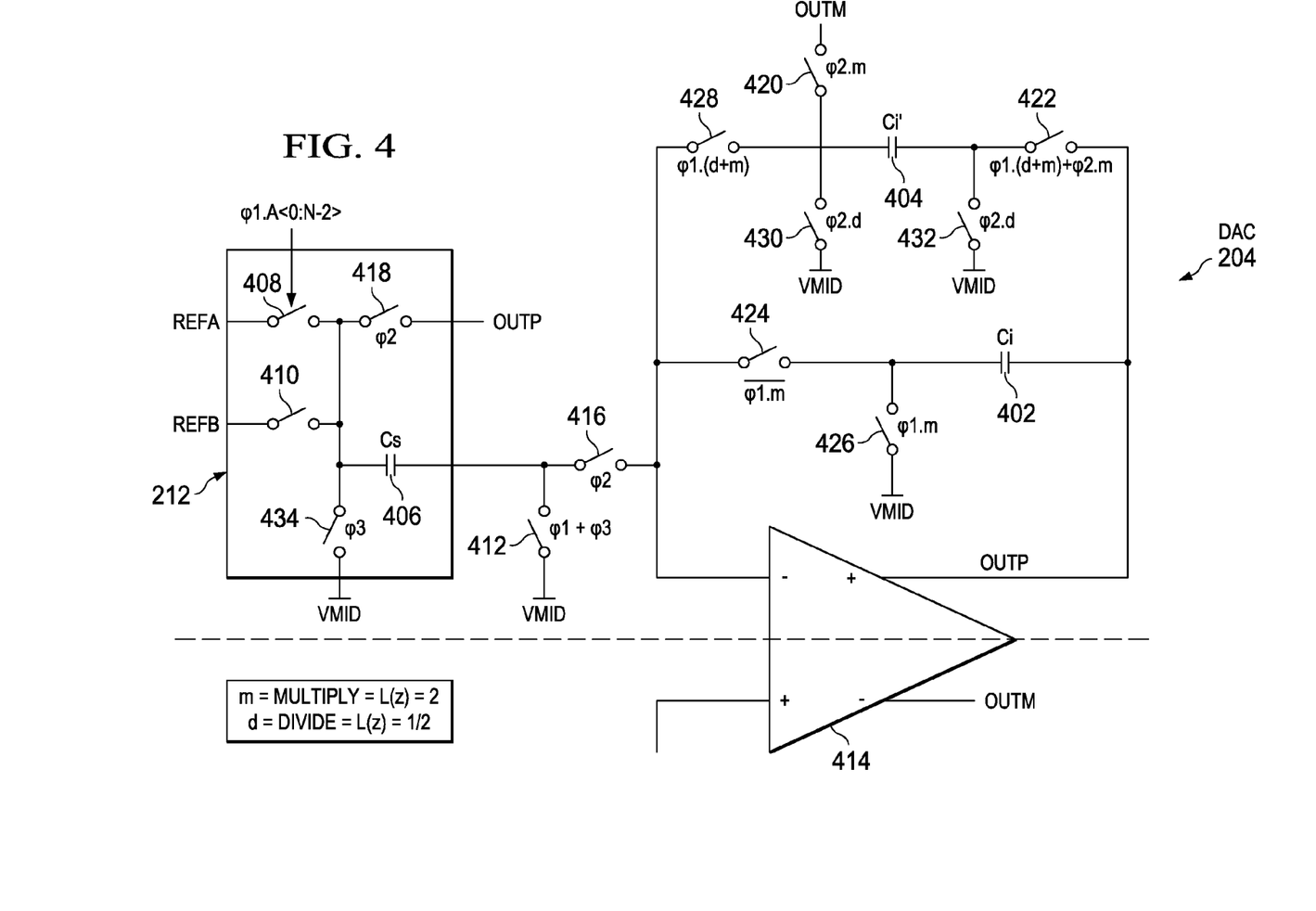
FIG. 4 is a circuit diagram of an example Digital-to-Analog Converter (DAC) of the audio downlink path of FIG. 2.

The modified DAC 204 receives the maximized digital signal output from the DRB 202 (possibly through a DEM 106). The operation of DAC 204 is illustrated in representative block diagram form in FIG. 2, while further details of the operation of the DAC 204 are illustrated in FIG. 4, discussed later in this disclosure. A known DAC 204 configuration involves a DAC sampler 212 that calculates and outputs an intermediate sample signal, represented as IN(Z), corresponding to the current incoming digital signal. The intermediate sample signal IN(Z) will enter the second half of the DAC 204 and will be operationally affected by a gain α, as shown by representative gain stage α214. The α-affected signal α*IN(Z) will then be added 215 to a feedback signal, being the previous output OUT(Z−1), which is affected by gain β to produce feedback signal β*OUT(Z−1), as is illustrated by representative gain stage β216. Thus, normally, the output of the DAC (such as DAC 108) can be equated as OUT(Z)=α*IN(Z)+β*OUT(Z−1). However, the new DAC 204 includes an additional gain stage 218 with gain L, which adjusts the feedback signal β*OUT(Z−1) (i.e., 216) by a feedback adjustment factor of gain L. When one takes in to account the gain G imparted on the incoming signal IN(Z) by the DRB 202, the output of the new DAC 204 is then OUT(Z)=G*α*IN(Z)+L*β*OUT(Z−1).

The relation between gain G and gain L is that gain L represents the calculated change in gain G, or a gain adjustment factor with which to adjust gain G. For example, assume a gain G(Z−1) was 4 for a previous incoming digital sample IN(Z−1) (meaning to increase the incoming signal to four times its original value, representing a gain of +12 dB), and the logic module 210 calculates that the gain G(Z) should be 8 for the current incoming digital sample (meaning to increase the incoming signal to eight times is original value, representing a gain of +18 dB). The new gain G(Z) at 8 is twice that of the previous gain G(Z−1) at 4. The logic module 210 will determine the gain L(Z) to be 2, representing the change in the gain G(Z)=8 from the previous gain G(Z−1)=4.

Continuing with this example, because the input signal IN(Z) is multiplied by the gain G(Z), the feedback will be multiplied by the gain adjustment factor L(Z). This allows the feedback signal β*OUT(Z−1) to scale in real-time with the changing input signal being affected by the changing gain G. In this example, the previous output OUT(Z−1) had been subject to a gain G(Z−1) of 4, so by multiplying the feedback signal β*OUT(Z−1) by the gain L(Z)=2, the DAC 204 effectively scales the previous G(Z−1) from 4 up to 8 on the feedback signal as well, which matches the current gain G(Z). This recursive operation makes the DAC 204 effectively operate on each current incoming sample IN(Z) as if each previous gain G had always remained the same.

Lastly, the output signal OUT(Z) is output to an audio driver 206 with a gain stage 220. Because the incoming signal IN(Z) is constantly being adjusted by a varying gain G (which is varying by the amount L on each new input sample), the output must be adjusted by an inverse of the new gain G (i.e., 1/G) to ensure the incoming signal is reproduced with an audio volume or other aspect as intended at the output. The logic module 210 outputs a gain 1/G which is fed to a latch 222 (optionally within the DAC 204). The latch 222 is configured such that it outputs the new 1/G(Z) signal to the audio driver 206 simultaneously when the current OUT(Z) signal is output to the audio driver 206. Thus, with each sample, the output gain is adjusted by a constantly changing gain of 1/G to remove the constantly changing gain G to reproduce the intended input signal. The audio driver 206 then amplifies the analog output signal from the DAC 204 via gain stage 220 to create an amplified analog output signal.

By this approach, the input signal is dynamically increased to maximize the DAC's 204 input capabilities (while avoiding saturating the DAC 204), thus increasing the DR of the audio downlink path.

Figure 3:
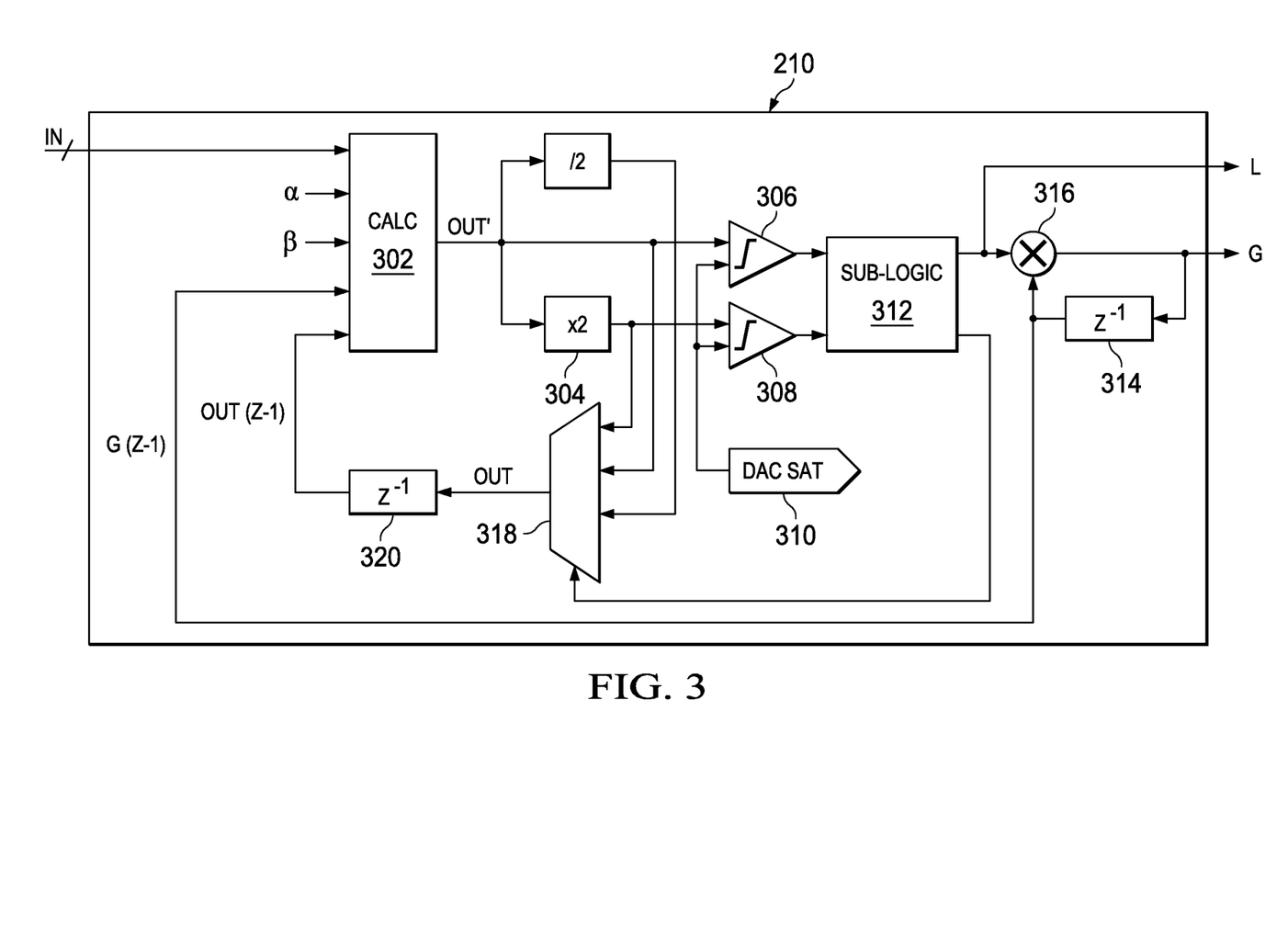
FIG. 3 is a block diagram of an example logic module of the audio downlink path of FIG. 2.

Turning now to FIG. 3, a block diagram illustrates further details of the logic module 210 according to various approaches. As discussed before with respect to FIG. 2, the logic module 210 receives the digital input signal IN(Z). The signal is routed to a calculator module 302. The calculator module 302 is also fed or has stored therein digitized modeled characteristics of the DAC 204 gains α and β. In operation, the calculator module 302 is configured to simulate and/or approximate the output of the DAC 204 in an instance where the gain G(Z) is equal to the previous gain G(Z−1), and is represented by signal OUT' (i.e., when L(Z)=1). To approximate this output OUT', the calculator module 302 also uses the previous gain G(Z−1) and the previous calculated approximation of the output OUT(Z−1). With this data, the calculator module 302 can calculate an approximation of the DAC 204 output by calculating an amplified digital signal (corresponding to gain stage G 208) by digitally amplifying the incoming digital signal by a previous gain G(Z−1). The calculator module 302 then approximates the output OUT(Z) by modeling the effect of α by the DAC 204 on the calculated amplified digital signal and of β on the previous approximation of output OUT(Z−1). This function can be written as OUT'(Z)=G*α*IN(Z)+β*OUT(Z−1). One will notice that this equation for OUT'(Z) is similar to the equation for the actual output of the DAC 204 for OUT(Z) as discussed above, but with gain L being omitted. This is because this equation assumes L=1 to assume the gain G(Z) does not change from the previous gain G(Z−1). As is discussed directly below, gain adjustment factor L(Z) and the actual gain G(Z) are calculated next based on the OUT'(Z) signal.

By one approach, the gain adjustment factor L(Z) is a multiplier selected from the group consisting of 2, 1, and ½, though other approaches may utilize other values. By this approach, to determine the gain adjustment factor L(Z), the logic module 210 will multiply 304 the output OUT'(Z) by 2, which corresponds to a gain adjustment factor L(Z)=2. The raw non-multiplied OUT'(Z) signal (representing L(Z)=1) is fed into a first comparator 306 and the doubled 2*OUT'(Z) signal (representing L(Z)=2) is fed into a second comparator 308. The first comparator 306 is configured to compare the approximation of the DAC 204 output OUT'(Z) to an approximation of a saturation level 310 of the DAC 204, which represents the highest input the DAC 204 can receive without saturating or clipping. If the approximated output level OUT'(Z) is higher than the saturation level 310, then the first comparator 306 will indicate it as such. For example, the first comparator 306 may be configured to output a high signal when the input exceeds the saturation level 310 and a low signal when it does not (though the opposite may work just as effectively). The second comparator 308 performs the same comparison, but instead for the doubled output signal 2*OUT'(Z).

The outputs of the comparators 306, 308 are then fed into a sub-logic module 312 which ultimately decides the highest gain adjustment factor L(Z) to use that does not exceed the saturation level of the DAC 204 when applied to the approximation of the DAC 204 output OUT'(Z). If both the outputs from the first comparator 306 and the second comparator 308 indicate that neither signal will exceed the saturation level, then this indicates that the DAC 204 will not saturate even if the input signal to the DAC 204 is doubled. In an effort to maximize the DAC 204 input, in such a situation, the sub-logic module 312 is configured to choose an L(Z)=2 to double the gain G on the input signal fed into the DAC 204.

If the output from the first comparator 306 indicates that the raw signal will not exceed the saturation level 310, but the output from the second comparator 308 indicates that the doubled signal will exceed the saturation level 310, this means that the current gain G is adequately high, but doubling that input signal (by doubling gain G) would saturate the DAC 204. In an effort to maximize the DAC 204 input without saturating the input, in such a situation, the sub-logic module 3012 is configured to choose an L(Z)=1 to keep the signal fed into the DAC 204 at its current gain G.

However, if the outputs from comparators 306, 308 both indicate that the input signals will saturate the DAC 204, then this means that not only would doubling the current gain G saturate the DAC 204, but even keeping the gain G at its previous level will saturate the DAC 204. Accordingly, in an effort to avoid saturating the DAC 204 input, in such a situation, the sub-logic module 312 is configured to choose an L(Z)=½ to reduce the gain G on the input signal fed into the DAC 204 by half.

The sub-logic module 312 will output the chosen L value. As is shown in FIG. 2, the gain adjustment factor L is output to the DAC 204 to adjust the feedback gain 218 accordingly. Additionally, the gain adjustment factor L is used to adjust the previous gain G(Z−1), which had been stored in a delay module 314 at the completion of the previous calculation, to determine the current gain G(Z). The adjustment is made by multiplying 316 the previous gain G(Z−1) by the gain adjustment factor L(Z) to output the new current gain G(Z). As is shown in FIG. 2, the new gain G(Z) is fed into the digital gain stage 208 to actually amplify the input signal IN(Z) by the calculated gain G(Z). The gain G (or its inverse) is also fed to the latch 222 for use by the audio driver 206 as described above.

The sub-logic module 312 will also output an indication of its selection of the L value to a multiplexor 318 (or similar device) that will selectively choose the correct OUT(Z) approximation for use as the feedback signal by the calculator module 302 for the next input sample. For example, if L(Z)=1, then OUT(Z) approximation=OUT'(Z) signal; if L(Z)=2, then OUT(Z) approximation=2*OUT'(Z) signal; if L(Z)=½, then OUT(Z) approximation=½*OUT'(Z) signal. Thus, the OUT(Z) approximation is an approximate image of the output of the DAC 204 according to the selected gains G and L. This is then fed into a delay module 320 that will store the value of the OUT(Z) approximation until the next sample IN(Z) is to be processed. At this time, OUT(Z) approximation becomes the OUT(Z−1) approximation and is fed back to the calculator module 302 to allow the process to repeat itself.

By this approach, the gain G can scale by a factor of 2. For example, the gain G can be 1, 2, 4, 8, 16, etc. (corresponding to 0 dB, +6 dB, +12 dB, +18 dB, +24 dB, etc). These teachings are highly scalable, however, and can be employed using other gain adjustment patters (i.e., L can be a factor of 3, or 5, or 7, etc) or even multiple levels of gain adjustment patterns (i.e., a single design where L can be a factor of 2 or 3, etc). The maximum gain G should be selected such that it is less than or equal to N−1 to avoid DAC 204 saturation, with N being the number of levels of the audio DAC 204 inputs. For example with a 17-level DAC, when a low signal is applied to the input of the audio downlink path 200, the maximum gain G can be a maximum of 16 so as to avoid saturation of the DAC 204 even with the lowest of input signals. It should also be noted that the operations of the logic module 210 can be purely digital and can be implemented via circuitry or software existing on one or more computer readable media.

Turning now to FIG. 4, a circuit diagram illustrates further details of the DAC 204 according to various approaches. By one example, the DAC 204 is a switched capacitor type that utilizes a direct charge transfer technique and first and second feedback capacitive components (capacitors $C_i$ 402 and $C_i'$ 404). Although a DAC 204 utilizing a switched-capacitor direct charge transfer technique is described here, other DAC 204 designs may exist or can be modified to suitably effectuate the adjustment of the feedback signal OUT(Z−1) according to L(Z), as described herein. The DAC 204 utilizes at least a three-phase scheme to convert the incoming signal G*IN(Z) to the analog output signal OUT(Z). The first phase φ1 is a sampling phase, the second phase φ2 is an integration phase, and the third phase φ3 is a reset phase.

During the sampling phase φ1, the DAC sampler 212 receives the bits of the incoming digital signal and converts those bits into a charge on one or more sampling capacitors $C_s$ 406 corresponding to the calculated intermediate sample signal IN(Z). Dependent upon the value of the incoming signal, the DAC sampler 212 selectively connects the one or more capacitor(s) $C_s$ 406 to one or more of the reference voltages REF A or REF B using switches 408 and 410. Typically, though not always, REF A and REF B voltages are equal and opposite of each other (i.e., REF A=REF A+ and REF B=REF A−). The other side of the capacitor(s) $C_s$ 406 is connected by switch 412 to the midpoint voltage $V_{mid}$ of the DAC 204 during the sampling phase φ1 so that the capacitor(s) $C_s$ 406 store a charge relative to $V_{mid}$.

During the integration phase φ2, the charge on the capacitor(s) $C_s$ 406 is placed across the input and the output of the op amp 414 by switches 416 and 418. This is understood as direct charge transfer, as the charge in the sampling capacitor(s) $C_s$ 406 corresponding to the intermediate sample signal IN(Z) is added 215 (see FIG. 2) with the feedback signal on the feedback integrator capacitor $C_i$ 402 corresponding to OUT(Z−1). The result is the new analog output signal OUT(Z), which is stored on the feedback integrator capacitor $C_i$ 402 by the end of phase φ2. The additional feedback integrator capacitor $C_i'$ 404 is configured to adjust the value of the charge OUT(Z−1) stored on capacitor $C_i$ 402 during the sampling phase φ1 when the value of gain adjustment factor L(Z) is 2 or ½ (and remains disconnected when L(Z)=1).

According to one approach, the switches 420, 422, 424, 426, 428, 430, 432 are configured to operate as follows to adjust the feedback signal OUT(Z−1) by gain L(Z)ϵ1, 2, or ½ to create an adjusted feedback signal. For example, when L(Z)=1, switches 420, 422, 426, 428, 430, 432 remain inactive and only feedback integrator capacitor $C_i$ 402 is utilized in a standard feedback integration configuration according to normal operation of a direct charge transfer integrator op amp. Use of the unaltered charge on capacitor $C_i$ 402 results in an unchanged feedback signal OUT(Z−1) having a gain of 1 corresponding to L(Z)=1.

When gain L(Z)=2, which corresponds to an "m" signal, or "multiply" signal, and when gain L(Z)=½, which corresponds to a "d" signal, or "divide" signal, the switches 420, 422, 424, 426, 428, 430, 432 will selectively operate in the different phases φ1 and φ2 to effectuate doubling or halving of the feedback signal OUT(Z−1) stored on the feedback integrator capacitor $C_i$ 402. It is during phase φ2 in which the feedback integrator capacitor $C_i$ 402 samples and stores the output (i.e., OUT(Z−1)), and also at which time capacitor $C_i'$ 404 is setup to adjust the feedback signal stored on $C_i$ 402 by the gain adjustment factor L(Z) during the next phase φ1 to create an adjusted feedback signal. In order to properly adjust the feedback signal for the next time Z, the signal L(Z) (and possibly the digital input IN(Z)) is actually fed to the DAC 204 during or directly prior to phase φ2 of time Z−1. Thus, the analysis begins with phase φ2 instead of phase φ1.

When L(Z)=2, in one approach, during phase 2 of time Z−1, switch 420 will couple one end of the feedback integrator capacitor $C_i'$ 404 to OUTM, while the other end of the feedback integrator capacitor $C_i'$ 404 is connected to OUTP by switch 422. Thus, feedback integrator capacitor $C_i'$ 404 samples two times the output signal OUT(Z−1) (i.e., (OUTP to $V_{mid}$)+($V_{mid}$ to OUTM)) because OUTP and OUTM are usually equal and opposite by operation of the op amp 414. The output signal OUT(Z−1) is a result of the addition of the charge from feedback integrator capacitor $C_i$ 402 (which at the beginning of phase φ2 contains the charge OUT(Z−2)) added 215 with the charge IN(Z−1) from the sampling capacitor(s) $C_s$ 406. To add 215 the charges from the sampling capacitor(s) $C_s$ 406, switches 416 and 418 operate to place the charge from sampling capacitor(s) $C_s$ 406 across the input and output of the op amp 414 in parallel with the feedback integrator capacitor $C_i$ 402 to form charge OUT(Z−1), which is stored on the feedback integrator capacitor $C_i$ 402 by the end of phase φ2.

Continuing with L(Z)=2, during phase φ3 of time Z−1, the switches 416 and 418 disconnect the sampling capacitor(s) $C_s$ 406 from the op amp 414 circuit and switches 414 and 434 clear the charge stored in sampling capacitor(s) $C_s$ 406.

Next, during phase φ1 of time Z, the charge IN(Z) is generated on the sampling capacitor(s) $C_s$ 406 through operation of switches 408 and 410 selectively connecting the sampling capacitor(s) $C_s$ 406 to REFA and/or REFB. Switch 412 keeps the other side of the sampling capacitor(s) $C_s$ 406 connected to $V_{mid}$ while 434 opens. While this occurs, the op amp 414 circuit is configured to provide the doubled feedback signal. Remembering that the feedback integrator capacitor $C_i'$ 404 contains twice the previous output OUT(Z−1), capacitor $C_i'$ 404 is substituted for capacitor $C_i$ 402 as the feedback capacitor. The feedback integrator capacitor $C_i$ 402 is disconnected from the input of the op amp 414 by opening switch 424 and connecting that same end of the feedback integrator capacitor $C_i$ 402 to $V_{mid}$ through switch 426. Capacitor $C_i'$ 404 is connected across the input and output of the op amp 414 by switches 422 and 428. Accordingly, by the end of phase φ1 of time Z, feedback integrator capacitor $C_i$ 402 will have stored thereon twice the value of OUT(Z−1) in preparation for the immediately following phase φ2 of time Z, thus effectuating doubling of the feedback charge.

To divide the feedback signal in half when indicated by L(Z)=½, by one approach, during phase φ2 of time Z−1, switches 430 and 432 will clear feedback integrator capacitor $C_i'$ 404 of its charge by connecting both ends to $V_{mid}$. As previously described, by the end of phase φ2 of time Z−1, feedback integrator capacitor $C_i$ 402 will have stored thereon the output signal OUT(Z−1). Phase φ3 of time Z−1 is identical to as was described above.

Continuing with L(Z)=½, during phase φ1 of time Z, the charge IN(Z) is generated on the sampling capacitor(s) $C_s$ 406 as described above. However, at this time, switches 428 and 422 are closed to place the empty capacitor $C_i'$ 404 in parallel with the feedback integrator capacitor $C_i$ 402 (which has stored thereon OUT(Z−1)). Assuming the capacitors $C_i$ 402 and $C_i'$ 404 have the same capacitance value, by the end of phase φ1, each capacitor 402, 404 will have half of the value OUT(Z−1). Thus, during the immediately following phase φ2 of time Z, the feedback signal OUT(Z−1) stored on $C_i$ 402 will have been halved prior to being added to the charge IN(Z) stored on the sampling capacitor(s) $C_s$ 406.

As described above, if L(Z)=1, according to one approach, switches 420, 422, 426, 428, 430, and 432 remain inactive and feedback integrator capacitor $C_i$ 402 operates unaltered to provide an unaltered OUT(Z−1) feedback signal.

Figure 5:
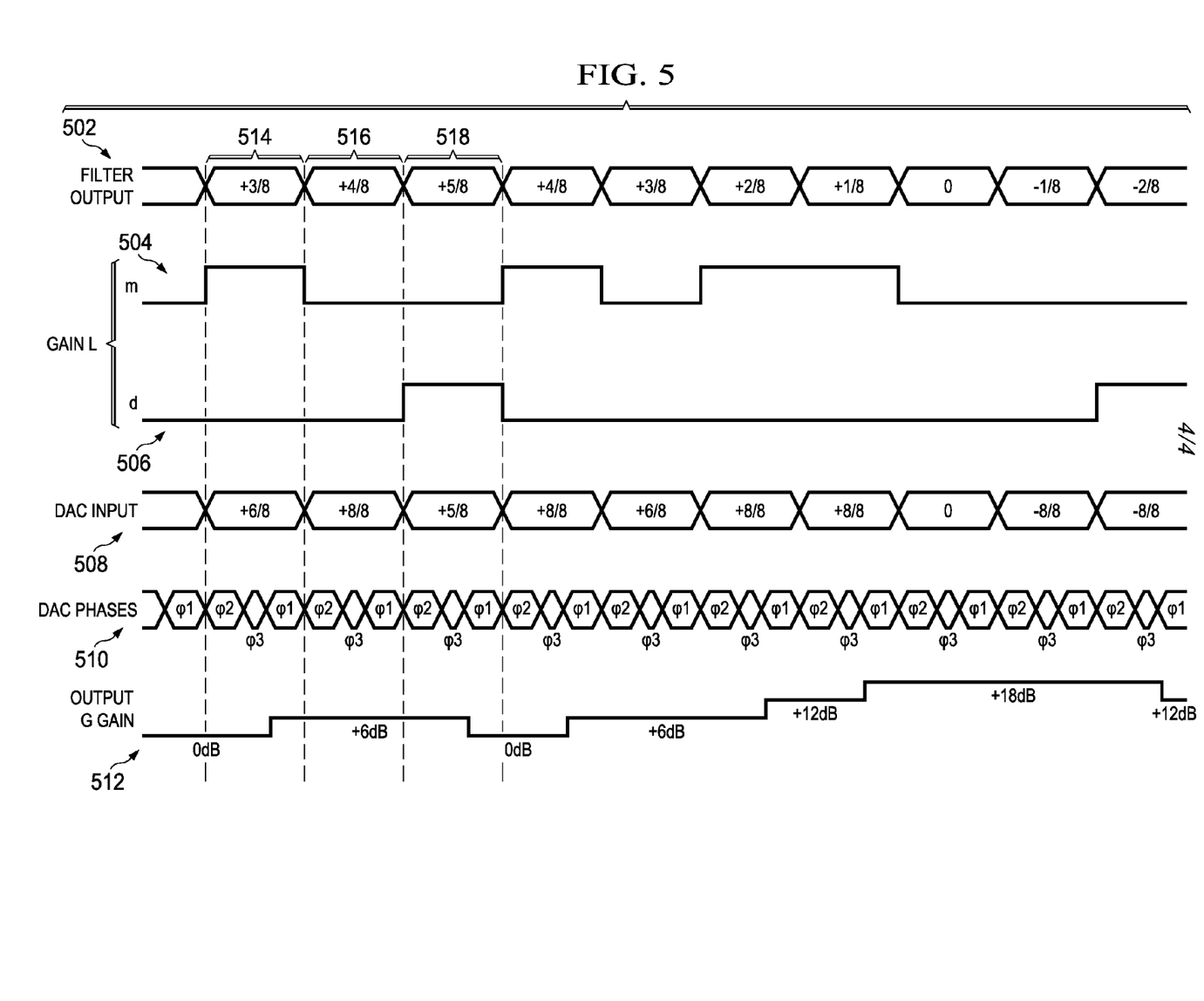
FIG. 5 is an example sample signal diagram illustrating operation of the audio downlink path in accordance with various approaches.

Referring now to FIG. 5, an example sample signal diagram is provided illustrating the operation of the modified audio downlink path 200 in accordance with at least one approach. The output of the optional digital filter 104 is shown on line 502 with varying values corresponding to 8 possible levels above and below 0 (i.e., +3/8, −2/8, etc). Lines 504 and 506 correspond to the "m" and "d" signals, where L(Z)=1 corresponds to both m=0 and d=0, L(Z)=2 corresponds to m=1 and d=0, and L(Z)=½ corresponds to m=0 and d=1. Line 508 is the input to the DAC 204 after the input signal has been digitally amplified by the gain stage G 208. Line 510 represents the timing phases φ1, φ2, and φ3 of the DAC 204. Lastly, line 512 represents the effective output Dynamic Boost Gain of the output of the DAC 204, which is output at the beginning of φ1. This gain Dynamic Boost Gain G 512 represents the inverse of the gain (1/G) the audio driver 206 must apply during amplification to reproduce the signal as intended.

The reader will notice that the DAC input signal 514 is at a value of +6/8 whereas the original digital filter 104 output value of +3/8 (representing a gain of 2). This is also shown by the gain of +6 dB that is output at the corresponding next phase φ1 (also representing a gain of 2). Next, during input segment 516, the logic module 210 will have determined that the previous gain of G(Z−1)=2 will be the highest that can be applied to the current input 516 (+4/8) without saturating the DAC 204 (+8/8), resulting in a DAC 204 input 508 value of +8/8. Because the gain G will not change from time Z-1 to time Z, the value for L(Z) will have been determined to be 1, meaning signals m 504 and d 506 both remain 0.

Continuing with this example, upon the next input 518, having the value +5/8, the logic module 210 will have determined that the previous gain G(Z−1)=2 (or +6 dB) will saturate the DAC 204 input (because +10/8>+8/8). Thus, the logic module 210 will have determined that the gain G(Z) must be reduced (by half in this example) to G(Z)=1 to avoid saturation. This requires a gain adjustment factor of L(Z)=½, which corresponds to a zero on the m signal 504 and a 1 on the d signal 506. Because gain G(Z)=½*G(Z−1)=1, the DAC 204 input signal 508 will be the same as the digital filter 104 output 502 at +5/8 during segment 518. The gain of G(Z)=1 is further illustrated by the output gain being set to 0 dB at the corresponding next 1 within segment 518, when the analog output signal is output by the DAC 204. The rest of FIG. 5 is provided to further aid the reader in understanding the operation of the new audio downlink path 200.

Accordingly, a new audio downlink path 200 is provided to effectuate high DR while maintaining a limited scale and complexity of the components therein. This allows for, in particular, a smaller DAC 204, the benefits of which include a reduction in the complexity, silicon space, power usage, and risk in design and manufacture of the DAC 204. Further, this solution does not introduce variable delay in signals, which ultimately reduces performance and creates noise. Further still, the solution can be implemented using digital control only, which aids in the ease of implementation and programming.

Many of the functional units described in this specification have been labeled as modules, in order to more particularly emphasize their implementation independence. For example, a module may be implemented as a hardware circuit comprising custom Very-Large-Scale Integrated (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A method comprising:
   at a Dynamic Range Boost (DRB) circuit:
      receiving a digital signal;
      calculating an approximation of an output level of a Digital to Analog Converter (DAC);
      comparing the approximation of the output level of the DAC to an approximation of a saturation level of the DAC;
      determining a gain adjustment factor by which to adjust a previous gain based on the comparing, the previous gain having been applied to a previous digital signal by the DRB circuit;
      adjusting the previous gain by the gain adjustment factor to create a new gain;
      digitally amplifying the digital signal by the new gain to create an amplified digital signal;
   at the DAC, wherein the DAC is coupled to the DRB circuit:
      calculating an intermediate sample signal responsive to the amplified digital signal;
      adjusting a feedback signal of the DAC by a feedback adjustment factor corresponding to a value of the gain adjustment factor to create an adjusted feedback signal;
      adding the adjusted feedback signal to the intermediate sample signal to create an analog output signal;
   at a gain stage coupled to the DRB circuit:
      amplifying a signal corresponding to the analog output signal by an inverse of the new gain to create an amplified analog signal.

2. The method of claim 1 wherein receiving the digital signal at the DRB circuit further comprising receiving the digital signal responsive to a digital filter.

3. The method of claim 1 wherein the digital signal received by the DRB circuit originates from a Pulse Density Modulated digital signal.

4. The method of claim 1 wherein the gain adjustment factor is a multiplier selected from the group consisting of 2, 1, and 0.5.

5. The method of claim 1 wherein calculating at the DRB circuit the approximation of the output level of the DAC further comprises calculating the approximation of the output level of the DAC using at least the digital signal, the previous gain, a previous calculated approximation of the output level, and at least one modeled characteristic of the DAC.

6. The method of claim 5 wherein calculating at the DRB circuit the approximation of the output level of the DAC further comprises:

calculating a calculated amplified digital signal by digitally amplifying the digital signal by the previous gain; and approximating the output level of the DAC by modeling an effect of the DAC on the calculated amplified digital signal and the previous calculated approximation of the output level using the at least one modeled characteristic of the DAC.

7. The method of claim 6 wherein determining at the DRB circuit the gain adjustment factor by which to adjust the previous gain further comprises:

determining the highest gain adjustment factor that, when applied to the approximation of the output level of the DAC, does not exceed the saturation level of the DAC.

8. The method of claim 1 wherein the DAC comprises a switched capacitor DAC using a charge-transfer technique that utilizes at least a first feedback capacitive component and a second feedback capacitive component.

9. The method of claim 8 wherein adjusting the feedback signal of the DAC to create the adjusted feedback signal further comprises at least one of:

increasing the feedback signal by storing in at least one of the first and second capacitive components a charge representative of twice the feedback signal and subsequently enabling the charge representative of twice the feedback signal to be added to the intermediate sample signal; and decreasing the feedback signal by removing a charge from at least one of the first and second capacitive components and storing a charge representative of the feedback signal in the other of the at least one of the first and second capacitive components and subsequently enabling the charge of the first and second capacitive components in parallel to be added to the intermediate sample signal.

10. An apparatus comprising:

a Dynamic Range Boost (DRB) circuit comprising:

at least one input configured to receive a digital signal;

a calculator circuit configured to calculate an approximation of an output level of a Digital to Analog Converter (DAC);

a comparing circuit configured to compare the approximation of the output level of the DAC to an approximation of a saturation level of the DAC;

a logic circuit configured to:

determine a gain adjustment factor by which to adjust a previous gain based on the comparing by the comparing circuit, the previous gain having been applied to a previous digital signal; and adjust the previous gain by the gain adjustment factor to create a new gain; and a digital amplification circuit to digitally amplify the digital signal according to the new gain to create an amplified digital signal;

the DAC operatively coupled to the DRB circuit and comprising:

a switching circuit configured to generate an intermediate sample signal responsive to the amplified digital signal; and an amplification circuit configured to:

adjust a feedback signal of the DAC by a feedback adjustment factor corresponding to a value of the gain adjustment factor to create an adjusted feedback signal; and add the adjusted feedback signal to the intermediate sample signal to create an analog output signal;

wherein a gain stage coupled to an output of the DAC is configured to amplify a signal corresponding to the analog output voltage according an inverse of the new gain.

11. The apparatus of claim 10 further comprising a digital filter coupled to the at least one input of the DRB circuit, and wherein the at least one input is further configured to receive the digital signal responsive to the digital filter.

12. The apparatus of claim 10 wherein the digital signal received by the at least one input of the DRB circuit originates from a Pulse Density Modulated digital signal.

13. The apparatus of claim 10 wherein the logic circuit is configured to select the gain adjustment factor from the group consisting of 2, 1, and 0.5.

14. The apparatus of claim 10 wherein the calculator circuit is further configured to calculate the approximation of the output level of the DAC using at least the digital signal, the previous gain, a previous calculated approximation of the output level, and at least one modeled characteristics of the DAC.

15. The apparatus of claim 14 wherein the calculator circuit is further configured to calculate the approximation of the output level of the DAC by:

calculating a calculated amplified digital signal by digitally amplifying the digital signal by the previous gain; and approximating the output level of the DAC by modeling the effect of the DAC on the calculated amplified digital signal and the previous calculated approximation of the output level using the at least one modeled characteristic of the DAC.

16. The apparatus of claim 15 wherein the logic circuit is further configured to determine the gain adjustment factor by which to adjust the previous gain by:

determining the highest gain adjustment factor that, when applied to the approximation of the output level of the DAC, does not exceed the saturation level of the DAC.

17. The apparatus of claim 10 wherein the DAC comprises a switched capacitor DAC using a charge-transfer technique and wherein the amplification circuit further comprises at least a first feedback capacitive component and a second feedback capacitive component.

18. The apparatus of claim 17 wherein the amplification circuit is further configured to adjust the feedback signal of the DAC by:

increasing the feedback signal by storing in at least one of the first and second capacitive components a charge representative of twice the feedback signal and subsequently enabling the charge representative of twice the feedback signal to be added to the intermediate sample signal; and decreasing the feedback signal by removing a charge from at least one of the first and second capacitive components and storing a charge representative of the feedback signal in the other of the at least one of the first and second capacitive components and subsequently enabling the charge of the first and second capacitive components in parallel to be added to the intermediate sample signal.

19. An apparatus comprising:

a Dynamic Range Boost (DRB) circuit comprising:

at least one input configured to receive a digital signal responsive to a digital filter and originating from a Pulse Density Modulated digital signal;

a calculator circuit configured to:

calculate a calculated amplified digital signal by digitally amplifying the digital signal by a previous gain, the previous gain having been applied to a previous digital signal; and calculate an approximation of an output level of a Digital Analog Converter (DAC) by modeling the effect of the DAC on the calculated amplified digital signal and a previous calculated approximation of the output level using at least one modeled characteristic of the DAC;

a logic circuit configured to:
   determine a highest gain adjustment factor that, when applied to the approximation of the output level of the DAC, does not exceed a saturation level of the DAC, wherein the gain adjustment factor is a multiplier selected from the group consisting of 2, 1, and 0.5; and
   adjust the previous gain by the gain adjustment factor to create a new gain;

a digital amplification circuit configured to digitally amplify the digital signal according to the new gain to create an amplified digital signal;

the DAC operatively coupled to the DRB circuit, wherein the DAC comprises a switched capacitor DAC using a charge-transfer technique, the DAC configured to:
   a switching circuit configured to calculate an intermediate sample signal responsive to the amplified digital signal;
   an amplification circuit comprising at least a first feedback capacitive component and a second feedback capacitive component, the amplification circuit configured to:
      multiply a feedback signal of the DAC by a value of the gain adjustment factor to create an adjusted feedback signal; and
      add the adjusted feedback signal to the intermediate sample signal to create an analog output signal;
   wherein a gain stage coupled to an output of the DAC is configured to amplify a signal corresponding to the analog output voltage according an inverse of the new gain.

20. The apparatus of claim 19 wherein the amplification circuit of the DAC is further configured to multiply the feedback signal of the DAC by:
   doubling the feedback signal when the gain adjustment factor is 2 by storing in at least one of the first and second capacitive components a charge representative of twice the feedback signal and subsequently enabling the charge representative of twice the feedback signal to be added to the intermediate sample signal; and
   halving the feedback signal when the gain adjustment factor is 0.5 by removing a charge from at least one of the first and second capacitive components and storing a charge representative of the feedback signal in the other of the at least one of the first and second capacitive components and subsequently enabling the charge of the first and second capacitive components in parallel to be added to the intermediate sample signal.

* * * * *